United States Patent
Downey et al.

(10) Patent No.: US 11,658,398 B1
(45) Date of Patent: May 23, 2023

(54) LIGHTWEIGHT CONFORMAL PHASED ARRAY ANTENNA USING AEROGEL SUBSTRATE

(71) Applicant: United States of America as represented by the Administrator of NASA, Washington, DC (US)

(72) Inventors: James M. Downey, Cleveland, OH (US); Bryan L. Schoenholz, Cleveland, OH (US); Marie T. Piasecki, Cleveland, OH (US)

(73) Assignee: United States of America as Represented by the Administrator of National Aeronautics and Space Administration, Washington, DC (US)

( * ) Notice: Subject to any disclaimer, the term of this patent is extended or adjusted under 35 U.S.C. 154(b) by 291 days.

(21) Appl. No.: 17/000,597

(22) Filed: Aug. 24, 2020

Related U.S. Application Data

(60) Provisional application No. 62/890,927, filed on Aug. 23, 2019.

(51) Int. Cl.
| | |
|---|---|
| *H01Q 1/28* | (2006.01) |
| *H01Q 3/30* | (2006.01) |
| *H01Q 9/04* | (2006.01) |
| *H05K 3/30* | (2006.01) |
| *H05K 1/18* | (2006.01) |

(Continued)

(52) U.S. Cl.
CPC ............. *H01Q 1/286* (2013.01); *H01Q 1/40* (2013.01); *H01Q 3/30* (2013.01); *H01Q 9/0414* (2013.01); *H01Q 9/0457* (2013.01); *H01Q 21/0075* (2013.01); *H01Q 21/0087* (2013.01); *H01Q 21/065* (2013.01); *H01Q 21/20* (2013.01); *H05K 1/181* (2013.01); *H05K 3/0058* (2013.01); *H05K 3/305* (2013.01); *H01Q 1/02* (2013.01); *H01Q 23/00* (2013.01); *H05K 2201/09018* (2013.01); *H05K 2201/10098* (2013.01)

(58) Field of Classification Search
CPC .......... H01Q 1/02; H01Q 1/286; H01Q 1/287; H01Q 1/40; H01Q 1/405; H01Q 3/30; H01Q 9/0407–0478; H01Q 9/045; H01Q 9/0414; H01Q 9/0457; H01Q 21/065; H01Q 21/0075; H01Q 21/0087; H01Q 21/20; H01Q 23/00; H05K 1/181; H05K 1/189; H05K 3/0058; H05K 3/0064; H05K 3/0067; H05K 3/305; H05K 2201/09018; H05K 2201/10098
See application file for complete search history.

(56) References Cited

U.S. PATENT DOCUMENTS

| | | | | |
|---|---|---|---|---|
| 10,446,920 B1 | * | 10/2019 | Meador | B32B 5/18 |
| 2018/0301808 A1 | * | 10/2018 | Olsen | H01Q 21/0025 |

* cited by examiner

*Primary Examiner* — Robert Karacsony
(74) *Attorney, Agent, or Firm* — Robert H. Earp, III; Mark Wolfgang; Trenton J. Roche

(57) ABSTRACT

A phased-array, conformal antenna and a method for forming same are disclosed. The method comprises forming a substantially planar layered antenna structure by fabricating a printed circuit board (PCB) on a substantially planar first substrate, adhering the PCB to a second substantially planar substrate, the second substantially planar substrate comprising an aerogel, adhering a plurality of antenna elements to the substantially planar second substrate to form the phased-array, adhering a protective layer to the one or more antenna elements, and shaping the substantially planar layered antenna structure to form a substantially curved layered antenna structure.

20 Claims, 13 Drawing Sheets

(51) Int. Cl.
    *H05K 3/00*        (2006.01)
    *H01Q 1/40*        (2006.01)
    *H01Q 21/06*      (2006.01)
    *H01Q 21/00*      (2006.01)
    *H01Q 21/20*      (2006.01)
    *H01Q 1/02*        (2006.01)
    *H01Q 23/00*      (2006.01)

LIGHTWEIGHT CONFORMAL PHASED ARRAY ANTENNA USING AEROGEL SUBSTRATE

CROSS-REFERENCE TO RELATED APPLICATIONS

This application claims the benefit of U.S. Provisional Application No. 62/890,927, filed Aug. 23, 2019, the entire contents of which are incorporated herein by reference.

ORIGIN OF INVENTION

The invention described herein was made by an employee of the United States Government and may be manufactured and used by or for the Government for governmental purposes without the payment of any royalties thereon or therefor. The invention described herein was made in the performance of work under a NASA contract, and is subject to the provisions of Public LAW 96-517 (35 USC 202) in which the Contractor has elected not to retain title.

FIELD OF DISCLOSURE

This disclosure relates to flexible antennas and antenna applications, particularly antennas that incorporate phased arrays that may be used for radio frequency (RF) communications. The antennas may be used to control and communicate with unmanned aerial vehicles, satellites, and ground stations.

BACKGROUND

For command and control (C2), many Unmanned Aerial Systems (UAS) can use line-of-sight (LOS) links to terrestrial ground stations. Networking several terrestrial ground stations can create a communications system with extended range to cover a larger geographic area. However, scalability of such networks is limited, particularly over water. In order to extend UAS operations to areas without terrestrial coverage, i.e., areas beyond-line-of-sight (BLOS), requires communicating via satellite links. Since satellites fly in geostationary orbits at very high altitudes, reliable communications to/from UAS operating in the lower atmosphere require large signal power or antenna gain. Power and gain generally scale with size and weight of antennas. There are considerable space and payload constrictions on UAVs making it difficult to accommodate large, powerful, but bulky and heavy antennas.

FIG. 1 shows a UAS 100 with both terrestrial and satellite links. Terrestrial links directly connect the remote pilot 102 to a UAV (e.g., UAV 104[1]) within line-of-sight (LOS) of a transmitter. This communication can be conducted either within direct radio LOS 106 with the remote pilot 102, or through a network of terrestrial stations (not shown). Such terrestrial links typically make use of an Aeronautical Mobile (Route) Service (AM(R)S) allocation in the 5 GHz band (5030-5091 GHz).

[1] Note that UAV 104 is represented in FIG. 1 as a generic airplane. UAVs throughout this disclosure are similarly represented. This is meant to show that the UAVs referenced by the present disclosure can take on any suitable form, including the form of presently developed UAVs and those yet to be developed. The particular form of the UAV is not critical to the disclosure.

When a UAV (e.g., UAV 108 shown in FIG. 1A) is not in radio LOS with the remote pilot 102, a link through a satellite 110 can be employed. Specifically, the remote pilot 102 relays instructions through a terrestrial unmanned aircraft control station (UACS) 112, via wired or non-wired connection 113. The UACS 112 then relays the communication via forward uplink to satellite 110 in channel 114. The UACS 112 also receives communications from the satellite 110 through the same channel 114. The satellite relays instructions for command and control to UAV 108 via communications channel 116.

It is possible that satellite links to UAVs can be implemented, for example, in the same band as terrestrial LOS due to a co-primary AMS(R)S allocation (see, e.g., communication link 118 in FIG. 1). However, satellites do not currently operate in this band. Satellite links 116 can, for example, currently operate in two Fixed Satellite Service (FSS) bands in the Ku- and Ka-Bands. Because many commercial satellite networks operate in both Ku- and Ka-Bands, a portion of these bands have been allocated specifically for UAV command and control. Table 1 shows the UAV allocations. This allocation makes it possible to use commercial FSS systems for UAV applications.

TABLE 1

World Radiocommunication Conference 2015
Allocations for UAS C2 in fixed satellite service.

| Band | Space-to-earth | Earth-to-space |
|---|---|---|
| Ku-Band | 10.95-11.2 GHz<br>11.45-11.7 GHz<br>11.7-12.2 GHz<br>(ITU Region 2)<br>12.5-12.75 GHz<br>(ITU Region 13) | 14-14.47 GHz |
| Ka-Band | 19.7-20.2 GHz | 29.5-30.0 GHz |

Currently, satellite connectivity is achieved by flying large parabolic dish antennas on the UAV. These large dishes typically require a large storage volume. They also require mechanical gimbal systems to move and direct the dish. The gimbal systems add size and weight to the already expensive UAV payload. They also drain precious power from the UAV.

There is currently a need for a conformal phased array antenna for satellite communications that could be installed onto the surface of a UAV airframe. A conformal antenna with a flexible, low-volume substrate, may weigh less and take up less volume than a parabolic antenna system. It could impose less drag and require less fuel. The conformal antenna could be used by smaller vehicles lacking storage space for larger parabolic antennas. This could increase range of operation by making satellite command and control viable.

SUMMARY

A method for forming a phased-array, conformal antenna is disclosed. The method comprises forming a substantially planar layered antenna structure by fabricating a printed circuit board (PCB) on a substantially planar first substrate, adhering the PCB to a second substantially planar substrate, the second substantially planar substrate comprising an aerogel, adhering a plurality of antenna elements to the substantially planar second substrate to form the phased-array, adhering a protective layer to the one or more antenna elements, and shaping the substantially planar layered antenna structure to form a substantially curved layered antenna structure.

Also disclosed is a phased-array, conformal antenna. The antenna comprises a substantially curved layered antenna structure comprising a PCB, an aerogel adhered to the PCB, a plurality of antenna elements forming the phased-array, the plurality of antenna elements adhered to the aerogel, and a protective layer adhered to the plurality of antenna elements.

The conformal antenna disclosed herein may, in some configurations, operate in the Ku band allocation for fixed satellite service (FSS) that can be provisioned for UAV. The antenna may operate at exemplary frequencies of 11.7-12.2 GHz on downlink (i.e., satellite to UAV). It may operate at exemplary frequencies of 14-14.5 GHz on uplink (i.e., UAV to satellite). The antenna's bandwidth may be wide enough to operate on both the uplink and downlink frequencies using the same aperture. It is to be understood that these frequency ranges are merely exemplary. The antenna system disclosed herein may operate in and/or be adapted for different frequency ranges.

The antenna may include an array of elements to create a phased array for electronically steering or directing radiation. The antenna may be adapted (e.g., by scaling up to an array of like antennas or like elements) to meet directivity and power requirements for connection with satellites in geostationary orbit. The antenna design may incorporate a dual stacked patch for wide bandwidth to cover both uplink and downlink frequencies. Alternatively, independent apertures may be used for the uplink and downlink frequencies.

The antenna can be supported by a flexible aerogel substrate reported previously in U.S. Pat. Nos. 9,356,341; 10,428,181; and 10,446,920, each of which is herein incorporated in its entirety by reference. Other low dielectric, flexible, and low density substrates may be used with this method. These other substrates include those made from certain low dielectric foams with advantageous mechanical properties, which may perform well especially at lower frequencies. Aerogels may perform better than certain foams at higher frequencies due to uniform nano-scale pore structure. The substrates may have a low dielectric allowing it to have a thickness comparable with respect to the wavelength of the signal, with little additional weight. This added thickness may increase the antenna's resonant bandwidth. The low dielectric constant of the substrate also may increase the total gain and radiation efficiency.

The antenna may include a triangular lattice spacing to, for example, keep uniform mutual coupling and to help maintain beam symmetry. The fabrication process may include patterning copper on a thin film of laminate, such as Pyralux laminate or other polyimide/fluoropolymer or low dielectric thin film, e.g., via lithography. This allows the metallic patch antenna elements (302a, 302b, 403) to be fabricated on thin, flexible, low dielectric carriers (e.g., 202a) using conventional fabrication processes. This combined with aperture coupling can increase the mass manufacturability of the aerogel antenna by avoiding direct metallization of the aerogels. The copper may be passivated by Electroless Nickel Immersion Gold plating to passivate and protect the copper from acidic components used in pressure sensitive adhesives. A thin layer of pressure sensitive adhesive may be used to bond the elements to the aerogel layers. Using a pressure sensitive adhesive may allow the use of aerogels with advantageous weight and dielectric properties, for example, that are less compatible with more traditional metallization and wet etching techniques.

The metallic elements and aerogel substrates may be bonded to a thin multi-layer microwave PCB. The PCB may house the microwave feed design, driving microwave electronics, and a microwave signal splitting network. A feed for the antenna may incorporate a tuned single or dual polarized aperture coupling structure. The tuned aperture coupling may reduce the requirement of thru hole metallization through the support substrates (e.g., aerogel substrates).

The microwave electronics may be designed, for example, to be compatible with beamforming radio frequency integrated circuits (RFIC) for transmit and receive. The RFIC may incorporate signal gain, amplitude and phase control, and polarization control. The microwave splitting network may incorporate a Sierpinski inspired fractal splitting scheme to efficiently divide a microwave signal in, for example, thousands of ways corresponding to elements in a phased array. It may feed each element of the array. Microwave splitting and routing to the RFIC may be integrated onto a single layer of the microwave PCB to keep the layer count down. This may reduce weight while maintaining flexibility.

Potential applications for the UAV and UAS antenna systems disclosed herein include, but are not limited to, emergency support, disaster relief, scientific, and package delivery. Applications further include coastal monitoring to detect, among other things, harmful algae blooms, turbidity in sea water, and warm temperature. Temperature detection, of sea water, other water, or atmospheric temperature may be input for weather forecasting. Other potential uses include pollution detection (e.g., off-shore oil spills), photogrammetry to monitor erosion over time, disaster assistance, hurricanes, marine life monitoring (e.g., whales, turtles, dolphins, other aquatic or avian species), and coastguard reconnaissance for safety and security. Other security and defense applications are also contemplated.

DETAILED DESCRIPTION

Figure 1:
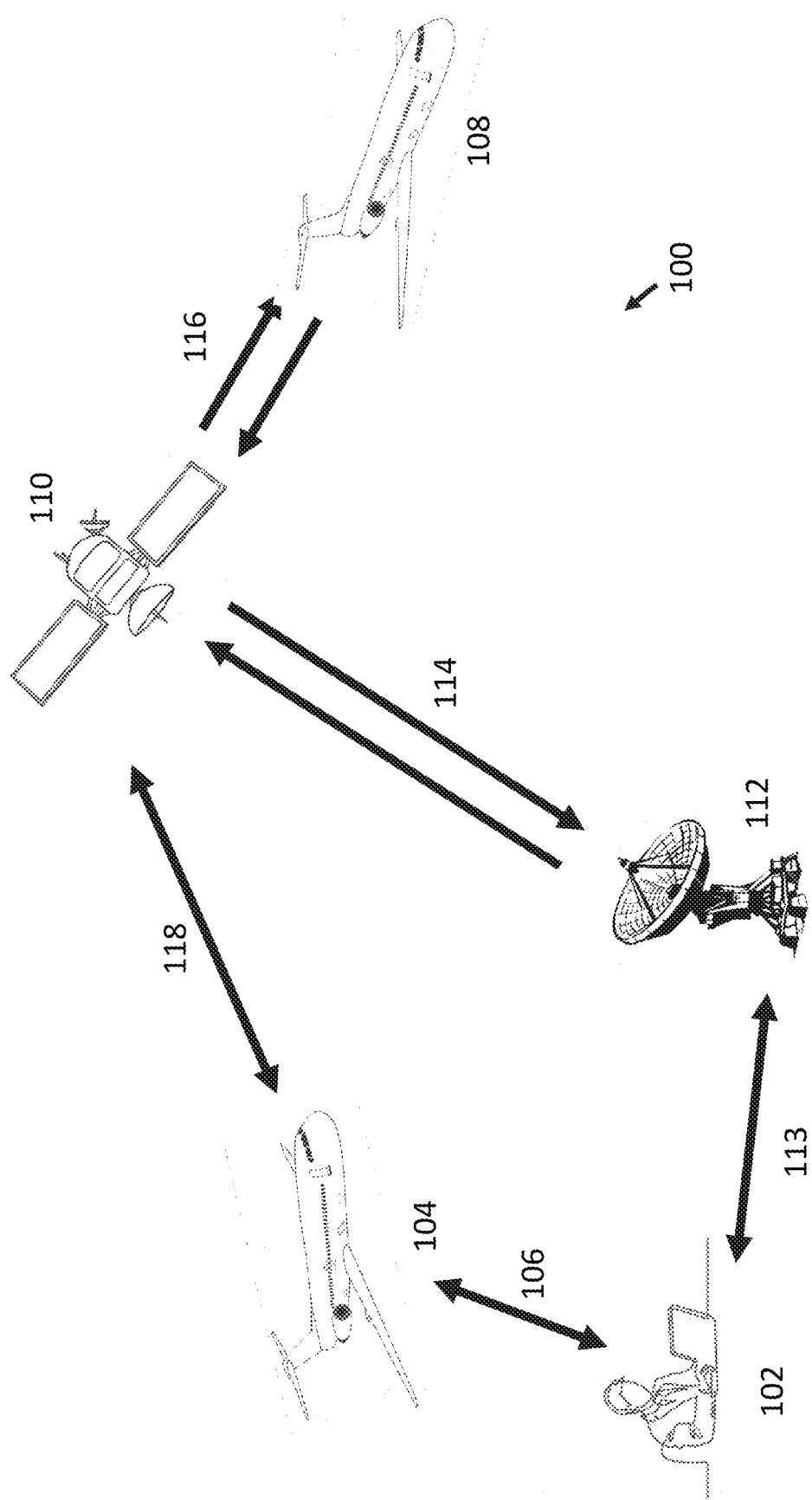
FIG. 1 shows a UAS 100 with both terrestrial and satellite links.
Figure 2A:
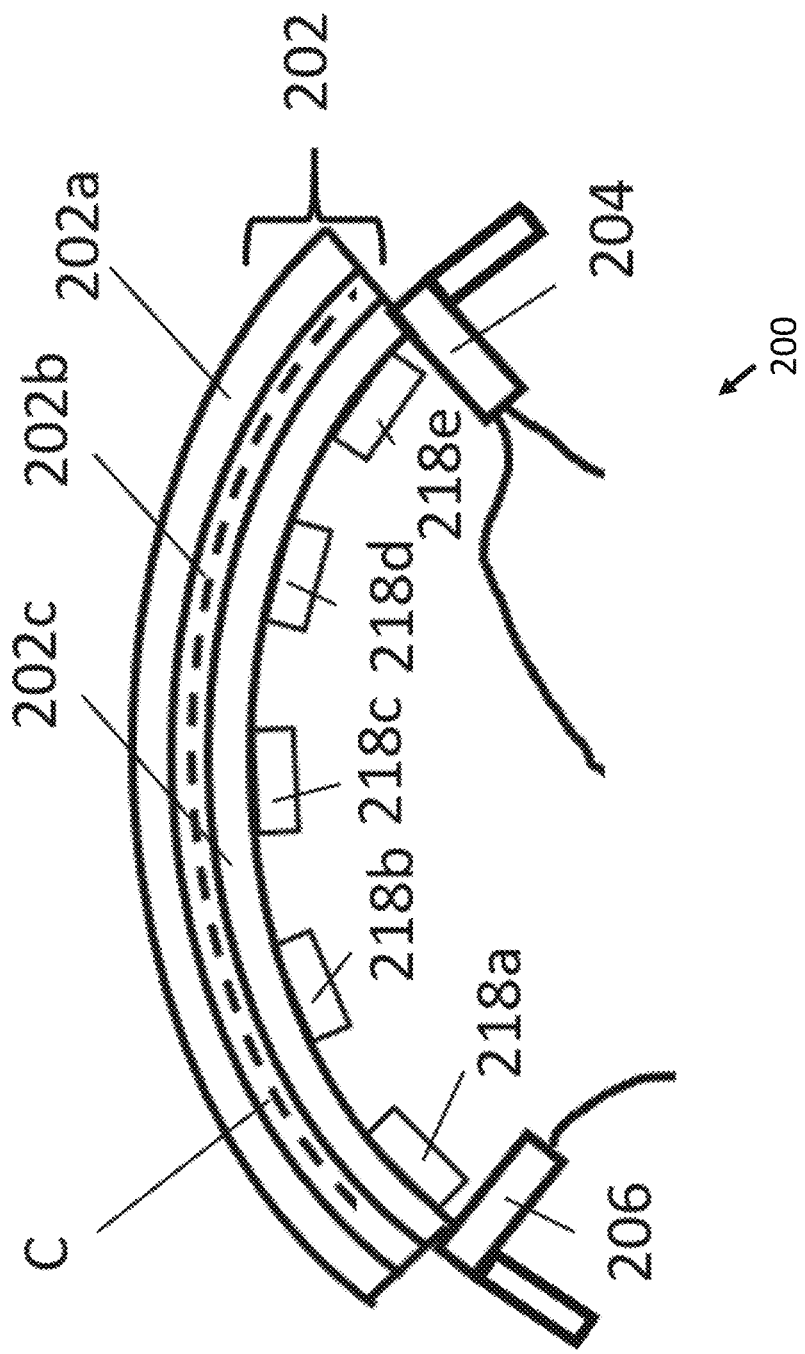
FIG. 2A shows an antenna 200 according to aspects of the present disclosure as deployed in a UAV.

FIG. 2A shows an antenna 200 according to aspects of the present disclosure as deployed in a UAV (e.g., in UAVs 104 and 108 in FIG. 1). As shown in FIG. 2A, antenna 200 has a layer stack 202 that includes at least one outer layer 202a. Outer layer 202a may be, for example, a protective layer (e.g., a radome layer made of, for example, a Kapton or other protective substrate). Outer layer 202a may protect inner layers from the environment (e.g., moisture and water absorption). Outer layer 202a may further include additional sections (not shown) for structural support or stress management for layer stack 202. For example, rigid sections designed to channel or manage stress may be included (not shown).

The interior 202b and 202c of antenna stack 202 may include at least one PCB with at least one antenna module (not shown). Interior 202b and 202c may include less traditional materials (e.g., aerogels, foams, or other materials not easily amenable to traditional PCB circuit fabrication technical, e.g., metallization). Structural support provided by the outer layer 202a may allow a PCB layer of the interior 202b to be fabricated using traditional techniques despite the inclusion of non-traditional materials in layers 202b and 202c. Preferably, as described in more detail below, interior 202b and 202c includes multiple antenna elements in an array. The array may be a phased array that can alter direction and intensity of transmitted or received signals.

As shown in FIG. 2A, antenna stack 202 may be flexed conformally so that it assumes a curvature C. It is to be understood that the degree of curvature C shown in FIG. 2A is merely exemplary. Any suitable curvature C is possible. For example, curvature C may be chosen to maximize a property such as gain or directionality of the antenna 200. Curvature C may also be chosen to best accommodate an interior storage space or mount for antenna 200 on the UAV. Conformal flexing of antenna stack 202 may be accomplished by reforming antenna stack 202 mechanically using a mandrel or other forming component (not shown). In addition, the mounting may include other components, such as those designed to channel heat away from the antenna during operation. Such components include thermally conductive pillars (not shown) connecting the PCB and active components to other components, such as a heat sink. In addition, elements of the antenna housing or casing (not shown) may include other heat sinks and/or heat other dissipating elements for removing thermal energy to maintain a temperature of the antenna below a certain threshold (e.g., maintain the temperature in a range of operating conditions).

Antenna 200 may further include external connections such as connectors for power and control 204 and RF signal 206. Connectors 204 and 206 may include multiple inputs and/or outputs.

Figure 2B:
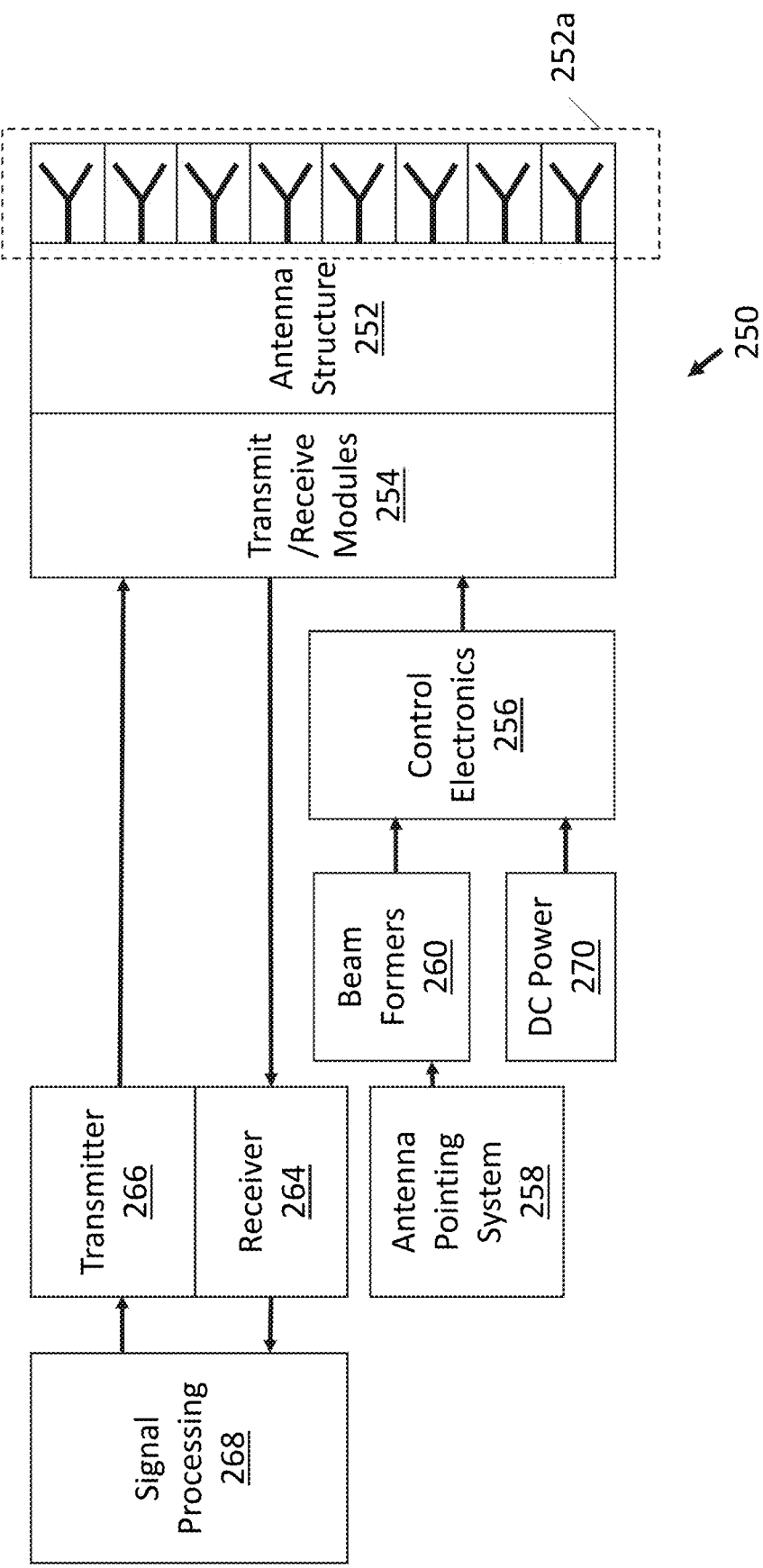
FIG. 2B is a schematic 250 showing various functional components of antenna 200 and interactions between those functional components.

FIG. 2B is a schematic 250 showing various functional components of antenna 200 and interactions between those functional components. It is to be understood that functional components in FIG. 2B may be realized with any suitable set of electronics and hardware. Although the functional components are shown in FIG. 2B as separate units or components, they may be realized in the same component or different components. Moreover, although exemplary communications/connections are shown between the functional components in FIG. 2B, it is to be understood that this is merely exemplary. Other communications/connections are possible and within the scope of the present disclosure.

As shown in FIG. 2B, antenna 200 may include the antenna structure 252, including radiating elements 252a. Elements 252a may be part of a phased array, as discussed in more detail below. There may be, for example, thousands of elements 252a to increase the gain or power of signal sufficient for UAV-satellite communications. The antenna structure 252 encompasses a layer stack, such as layer stack 202 shown in FIG. 2A.

The antenna structure 252 sends and receives signals from the transmit/receive modules 254. It is to be understood that the transmit/receive modules 254 may mounted directly on the layer stack 202 or may be remote from the layer stack 202. The transmit/receive modules 254 and/or antenna structure 252 also receive commands from control electronics 256. Commands received from control electronics 256 may, for example, relay antenna position or steering commands from the antenna pointing system 258. Antenna array structure 252 may include combined transmit/receive modules 254 as shown in FIG. 2B. However, the transmit/receive modules 254 could alternatively be separated into a transmit array and a receive array (not shown).

Antenna 200 may also include beam-formers 260, such as an adaptive beamformer designed, to provide spatial signal processing with an array of transmitters or receivers. Beam formers 260 may control elements 252a, which form a phased array. Any suitable technique using beam formers to direct the signal to a chosen direction known in the art are possible. Techniques are discussed in more detail below in reference to the specific elements of the phased array.

Antenna 200 may further include transmitter 266 and receiver 264. Both receiver 264 and transmitter 266 communicate with signal processing electronics 268. Signal processing electronics 268 may perform a variety of signal processing functions, including filtering, signal deconvolution, encoding/decoding, etc. Signal processing electronics 268 may assist in beam forming and steering (e.g., may assist beam formers 260 and antenna pointing system 258). The UAV may provide power to antenna 200 via DC power module 270.

Figure 3A:
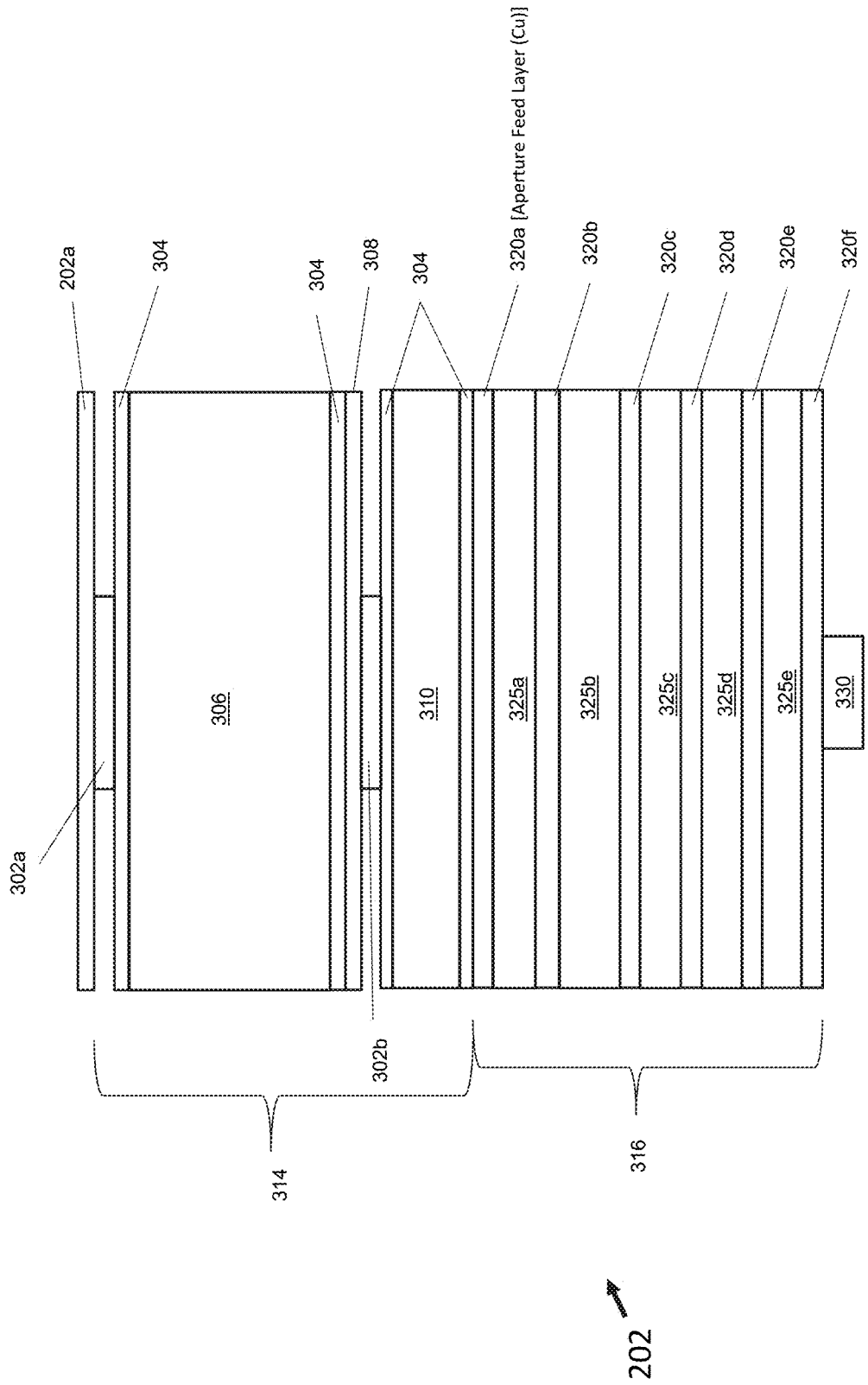
FIG. 3A shows an exemplary layer stack 202 that can be included in antenna 200.

FIG. 3A shows an exemplary layer stack 202 that can be include in antenna 200. FIG. 3A shows the outer layer 202a as a radome. As discussed above, the radome may be a dome or other structure protecting equipment. The outer layer 202a may protect antenna 200 from the environment, including from rain and moisture/water absorption. It may be made from material transparent to radio waves, e.g., Kapton, polyimide or other low-dielectric constant, flexible protective materials (plastics, e.g., polytetrafluoroethylene, polyurethane, acrylics, vinyl, etc.).

Elements 302a and 302b on either side of substrate 306 form a single stacked patch element. As discussed in more detail below, the stacked patch, antenna element (302a/302b) is part of a phased array of like stacked patch elements. The other elements in the phased array would be placed to either side of stack 202 in a lateral configuration. They would be identical or similar to stack 202. The stacked patch elements are the active elements of the antenna 200 (e.g., corresponding to individual radiating elements 252a of antenna structure 252 shown in FIG. 2B). Therefore, it is to be understood that FIG. 3A shows only one of a many stacked patch elements 302a/302b. In UAV implementation, phased array implementation, or satcom implementation, there may be thousands of such stacked patch elements 302a/302b in the plane of the array. FIG. 3A also shows layer 308, which is a thin low-dielectric carrier (e.g., Pyralux TK) for copper patch antennas.

FIG. 3A shows the outer layer 202a and stacked patch element 302a/302b adhered to the rest of the layer stack 202 via a pressure sensitive adhesive layer 304. Stack 202 may include a substrate 306 that provides structural integrity and flexibility to the stack. Stack 202 in FIG. 3A also shows an optional second substrate 310 that may be included along with substrate 306.

Substrates 306 and 310 may provide support for the stack 202. Substrates 306 and 310 may include low dielectric materials such as aerogels. The materials may have a low loss tangent, such as a loss tangent between 0.0001 and 0.005. These properties, among others, can help to increase bandwidth and gain compared to more traditional substrates for similar antennae to 200. Substrates 306 and 310 may include pore structures (e.g., substantially uniform pore structures) to maintain antenna 200 performance at high frequency (e.g., frequencies in the Ku and Ka bands in Table 1). Other important properties for substrates 306 and 310 may include mechanical flexibility for flexing (e.g., so that the layer stack 202 may assume curvature C shown in FIG. 2A and/or so that layer stack 202 may be further flexed). Substrate properties may include a relatively low dielectric constant so as not to interfere with transmission of signals from the antenna 200. Exemplary substrate 306 and 310 materials that may be used in the context of the present disclosure include, but are not limited to, polymeric aerogels, including polyamide and polyimide aerogels, as well as foam materials. In particular, polyimide-based aerogels may be more mechanically robust than other aerogels, such as silica-based aerogels. Polyimide aerogels can incorporate a relatively low dielectric constant. In addition, suitable substrate materials 306 in accordance with the present disclosure include pores on the nanoscopic scale (e.g., of 9 nm in diameter or less) so as not to be resonant with the radio communications transacted by antenna 200.

Substrates 306 and 310 may include, for example, compounds such as those disclosed in U.S. Pat. Nos. 9,356,341; 10,428,181; and 10,446,920. These may include, for example, 4,4'-oxydianiline (ODA), 2,2'-Dimethylbenzidine (DMBZ), 1,3-Bis(4-aminophenoxy)neopentane (BAPN), 1,5-diamino-2methylpentante (DAMP), and 1,12-diaminodocange (DADD), whose molecular structures are shown below:

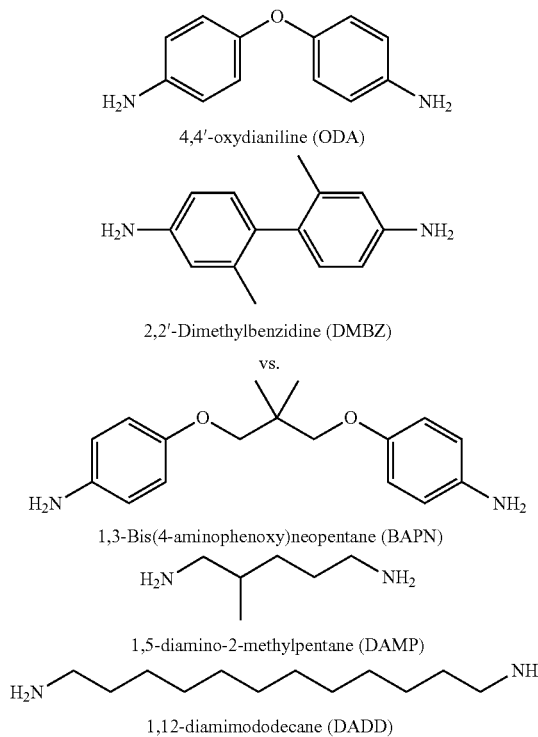

Substrates 306 and 310 may further utilize aliphatic diamines to replace aromatic diamines (e.g., use aliphatic diamines to replace 25-75% of aromatic diamines in the above structures). In some embodiments, the modulus of the aerogel increases with density of the aerogel corresponding to an increase in aliphatic content. For example, DMBZ backbone has a higher modulus than ODA at lower density. These properties may be leveraged to optimize the operating characteristics of the aerogels, as described above (e.g., modulus, flexibility, etc.), within the context of the present disclosure. Substrates 306 and 310 are not limited to aerogel materials. Other low dielectric, flexible, substrates may be used, such as certain foams with similar dielectric and mechanical properties as the aerogels described above.

More generally, suitable materials for substrates 306 and 310 may include those materials that create more bendable or flexible aerogels, particularly when the aerogels have a thickness in the range of 2-3 mm. Suitable aerogel materials can have relatively high bulk moduli, between 10-100 MPa. Suitable aerogels have a density of, for example, 0.3 g/cm$^3$ or less, or 0.11 g/cm$^3$ or less. Suitable aerogel materials can have a relatively low dielectric constant, such as between 1 Dk and 1.4 Dk, or more. As discussed above, the porosity/density of the aerogel material may be tuned to yield a lower dielectric constant. The aerogel materials will generally have robust mechanical properties, including high flexibility and high yield strength. For example, aerogel materials with a yield strength between 9-50 MPa are suitable. Aerogel materials suitable for use in the present disclosure also may have substantial resistance to moisture and/or waterproofing properties. It is to be understood that aerogel formulations described above, as well as additional suitable aerogel formulations that exhibit at least one of the dielectric, weight, mechanical properties preferred may be utilized within the context of the present disclosure.

Attached to substrates 306 and 310 via pressure sensitive adhesive 304 are the other portions of antenna 200, including outer layer 202a and the PCB 316. Suitable pressure sensitive adhesives, include acrylic, silicone-based pressure sensitive adhesives, rubber-based pressure sensitive adhesives, epoxy, resin, hot-melt pressure sensitive-adhesive, pressure sensitive adhesive tape, solvent or water based pressure sensitive adhesive, butyl rubber, ethylene-vinyl acetate, natural rubber, nitriles, silicon rubbers, silicate resins, and styrene block copolymers.

As discussed above, attaching PCB 316 via pressure sensitive adhesive 304 allows the fabrication of PCB 316 components and connections via techniques (e.g., wet etching and electroplating, high pressure bonding cycles, infrared soldering, etc.) that may not be especially amenable to aerogel materials.

Substrates 306 and 310 may be relatively thick. A relatively thick flexible aerogel layer (~2 mm) can increase benefits from low dielectric constant for efficient radiation. In one exemplary configuration, substrate 306 may be 2.5 mm in thickness and substrate 301 may have a thickness of 0.8 mm. However, other thicknesses (e.g., 0.1 mm, 0.5 mm, 3.0 mm or more) may be possible. The thickness may depend on the design and the frequency range of antenna application. In particular, the overall thickness may change with frequency for a given geometry. The thickness may be optimized for the antennas resonant frequency and considerations to mutual coupling, changing requirements on frequency and pattern performance, allowing changes to the thickness of aerogel layers.

Element 314 in FIG. 3A represents a stacked patch antenna element including both elements 302a and 302b, as well as substrates 306 and 310. Elements 302a and 302b may be aperture coupled via aperture feed layer 320a. Aperture feed layer 320a will be described in more detail in the context of FIG. 3B (below). Other methods that may be used to feed patch antennas may also be employed. These include probe feeds and transmission line feeds.

Since PCB 316 can be fabricated entirely or partially prior to adherence to the substrates 306 and 310, traditional manufacturing processes for PCBs and other circuit boards may be used. For example, PCB 316 connections may be fabricated via photolithography, soldering, metallization, electroplating, high pressure lamination. These techniques may be less compatible with many aerogel or similar materials. For this reason, performing these techniques on the PCB 316 prior to adherence to substrates 306 and 310 may be advantageous.

PCB 316 may include stacked layers 320a-f that may house a microwave feed design, driving microwave electronics, and microwave signal splitting network. Microwave electronics include beamformer RFIC's for Ku-band transmit and receive. Layers 320a-f may include one or more RFICs incorporating signal gain, amplitude and phase control, and polarization switching. A microwave splitting network facilitated by layers 320a-f may incorporate a fractal splitting scheme to effectively divide a microwave signal and feed each element of the array (e.g., array 252a). Microwave splitting and routing to the RFIC may be tightly integrated onto a single layer of the PCB 316 to reduce layer count of PCB 316 and increase physical flexibility. Reducing layer count, in particular, may increase flexibility of stack 202. Layers 320a-f may further include various wire configurations, including various digital control interfaces, such as serial peripheral interface, and power bus distribution. They may further include Grounded Coplanar Waveguide (GCPW) and stripline transmission lines for Radio Frequency (RF) signal routing. They may also include a layer or layers including embedded thin film resistors. The latter can be used for splitting networks in the strip-line layer.

Layers 320a-f may include, in no particular order, layers with: power supply/regulation electronics and connections, digital processing components and connections, layers for splitting RF signals among different portions of the antenna 200 (e.g., portions of the antenna whose signals may require different or separate processing, segments that are physically separated because of the antenna 200 layout or because of a stacked array of similar antennae 200, etc.), and layers for signal processing and transmission. Layers 320a-f may further include functional components shown in FIG. 2B, for example, transmit/receive modules 254, control electronics 256 antenna pointing system 258, beam-formers 260, DC and logic distribution 262, receiver 264, transmitter 266, signal processing element(s) 268, and UAV power module(s) 270.

Structural layers 325a-e may be placed between metal layers 320a-f to, for example, provide support to layers 320a-f. Structural layers 325a-e may be made from a variety of materials. For example, structural layers 325a-e, may include laminates, plastics, resins, epoxies, polymers (e.g., PTFE), weaves (e.g., woven glass fibers), ceramics, hydrocarbon/ceramic composites with fiber reinforcements, etc. It may be favorable to include at least some fiberglass in structural layers 325a-e. Fiberglass can prevent layers 325a-e from stretching, which can present mechanical problems, especially if layers 325a-e are relatively thin (thickness of ~0.1 mm). In exemplary embodiments, 5% fiberglass in structural layers 325a-e can allow sufficient flexibility and avoid stretch/failure problems. Fiberglass content from 0 to 50% in structural layers 325a-e is also possible and consistent with the present disclosure.

Lower regions of stack 202 may include a transmit/ receive module 330. Transmit/receive module 330 can be specialized for UAV applications. However, it may not be. Other radio frequency transmit/receive modules 330 may also be used. Transmit/receive (TR) modules control the electronic weighting of the amplitude and phase of signals going to the stacked patch elements. Also, layer 330 may include separate transmit and receiver modules. Examples include the Anokiwave AWMF-0117 Transmit Receive (T/R) Module and Analog devices ADAR1000, among others.

Figure 3B:
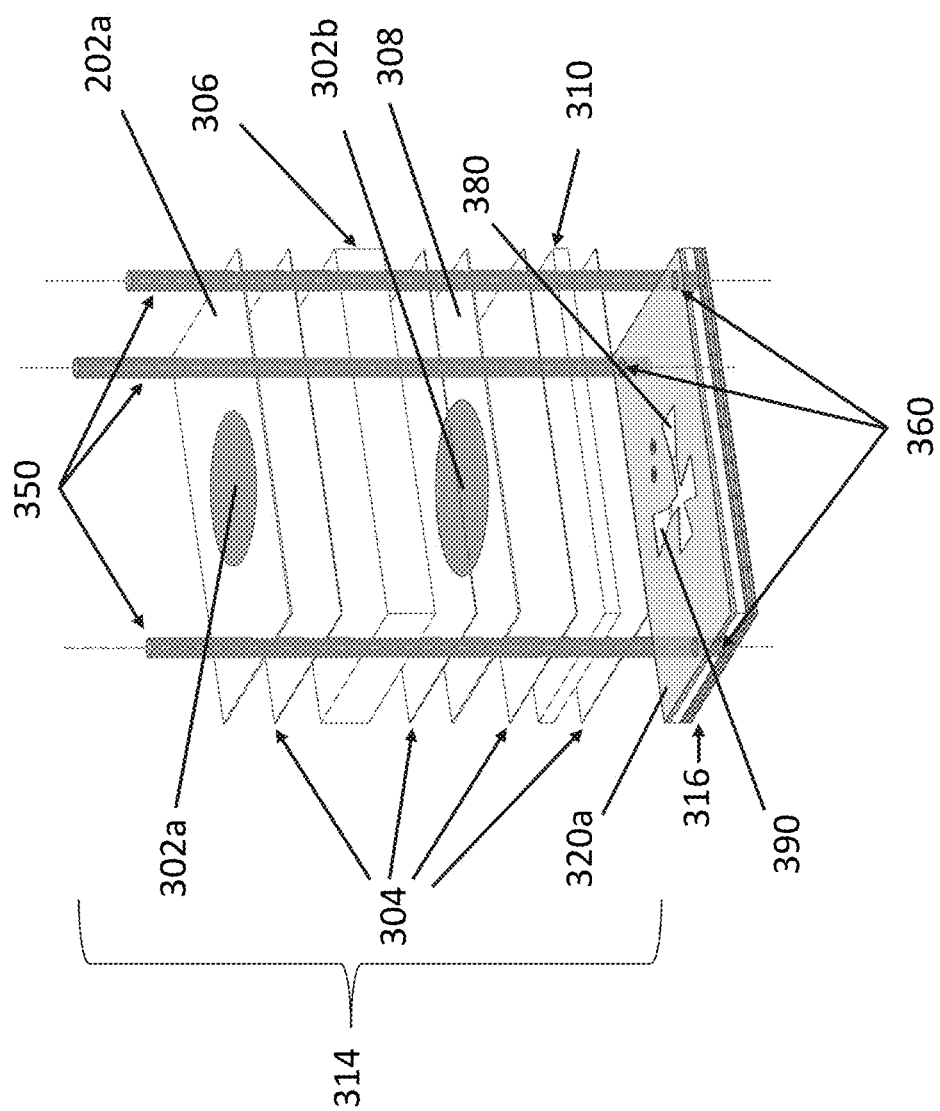
FIG. 3B is an exploded view of a stacked patch element 314 as it is assembled and adhered to PCB 316.

FIG. 3B is an exploded view of stacked patch element 314 as it is assembled and adhered to PCB 316. As shown in FIG. 3B and discussed in the context of FIG. 5, layers of stacked patch element 314 may be aligned using alignment posts 350 that fit into holes 360 in aperture feed layer 320a and the rest of PCB 316. FIG. 3B shows how pressure sensitive adhesive 304 can be used to adhere various layers of stacked element 314.

FIG. 3B also shows each element 302a and 302b in relief. One can see from FIG. 3B that each element 302a and 302b may be supported by dielectric materials 202a and 308, respectively. Once assembled, stacked element 314, comprising both 302a and 302b, will form a single element of a multi-element array. Additional stacked elements (not shown) will be provided laterally adjacent to element 314 and will most likely be identical or nearly identical.

FIG. 3B also shows, in detail, the aperture coupling layer 320a. In particular, the figure shows aperture 380. Examples of aperture 380 include a dual linear polarized aperture which can substitute for metallized contacts through the support structures (aerogel or foam substrates 306 and 310). Similar coupling elements have been described in the context of K-band antennas.[2] In particular, aperture 380 may include a tuned dual linear aperture feed design to reduce metallization throughout the substrates. One purpose is to replace through-hole connection, which can be difficult to sustain in aerogel or other similar materials because of their mechanical properties. Aperture 380 coupling can transmit signals wirelessly, similarly to capacitive coupling. For example, an offset stripline feed 390 may be used to maximize coupling from the high dielectric layers to the low dielectric aerogel layers. Dual bowtie slot apertures 380 adapted for low loss coupling at the operational frequency band may be used. This type of coupling can, in some cases, outperform wired connections that tend to limit bandwidth.

[2] https://ieeexplore.ieee.org/document/4250840

Figure 4:
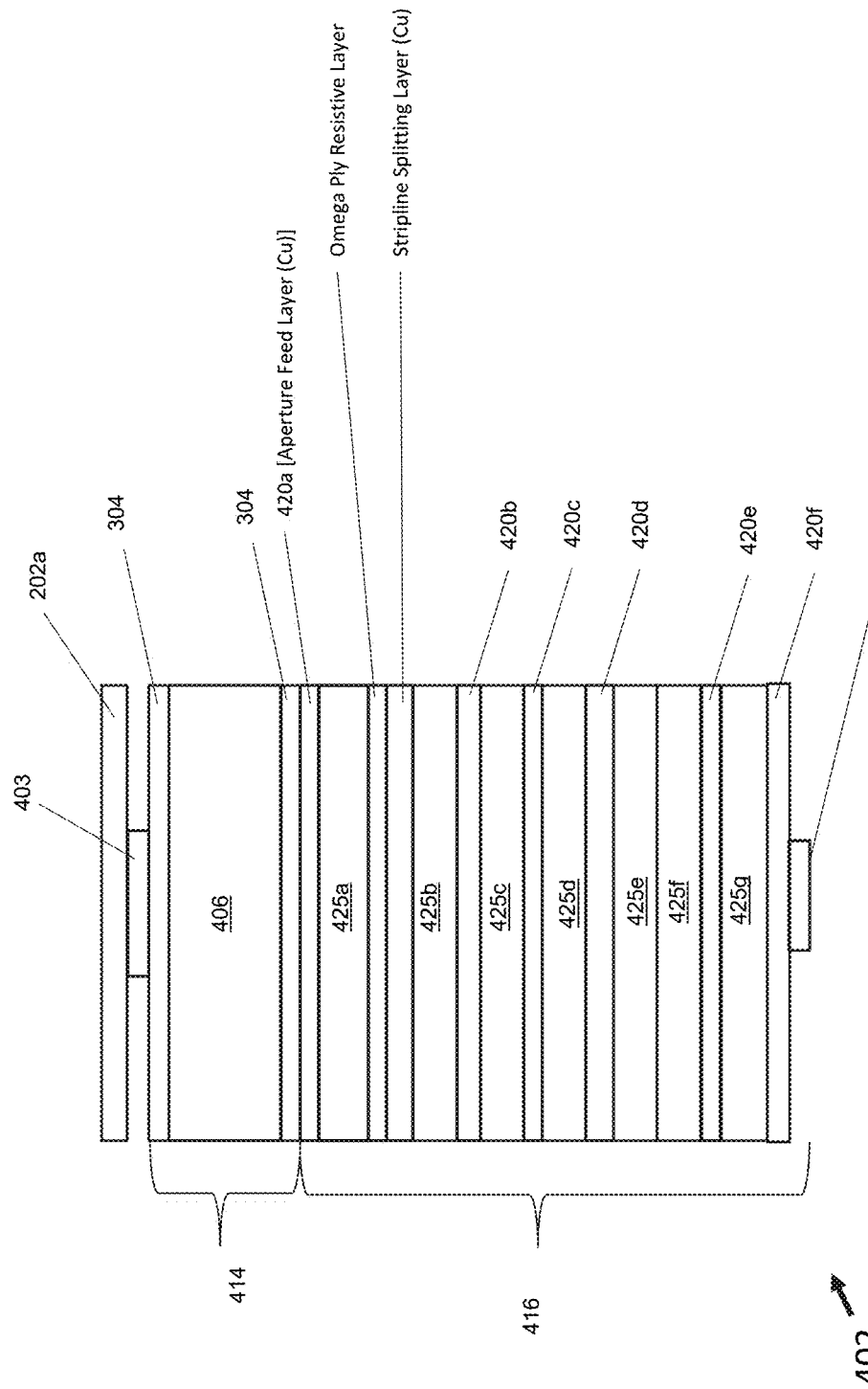
FIG. 4 shows another layer stack 402, in accordance with the present disclosure.

FIG. 4 shows another layer stack 402, in accordance with the present disclosure. Layer stack 402 has a single substrate 406 (in contrast to stack 202, having two substrates 306 and 310) that may be used in place of stack 202 in antenna 200. Like stack 202, stack 402 has an outer layer 202a, which may be a radome layer as discussed above.

FIG. 4 shows the outer layer 202a and an antenna stack element 403 are adhered to the rest of the layer stack 402 via a pressure sensitive adhesive 304. Patch element 403 is analogous to the stacked patch, antenna element (302a/ 302b) in FIGS. 3A and 3B. Like element 302a/302b, patch element 403 is part of a phased array of like patch elements which make up the active elements of the antenna 200 (e.g., corresponding to individual radiating elements 252a of antenna structure 252 shown in FIG. 2B). The other elements in the phased array would be placed to the left and right of stack 402 (i.e., laterally) and may be substantially identically to stack 402. Therefore, it is to be understood that FIG. 4 shows only one of a many patch elements 403. As with elements 302a/302b, there may be many patch elements 403 in a UAV implementation of stack 402 in antenna 200.

Substrate 406 can provide structural integrity and flexibility to stack 402, and may function as a flexible substrate. Substrate 406 may include the aerogels, foams, or other materials discussed above in the context of substrates 306 and 310. As with substrate 306 and 310, substrate 406 may offer a low and controlled dielectric constant along with a low loss tangent.

Attached to substrate 406 via pressure sensitive adhesive 304 are the other portions of antenna 200, including outer layer 202a and the PCB 416. This may be accomplished in a manner similar to that described above in the context of FIG. 3B. As discussed above, an advantage of attaching PCB 416 via pressure sensitive adhesive 304 allows the fabrication of PCB 416 components and connections separately from aerogel components using fabrication techniques not easily amenable to aerogel materials. For example, metallization of connections both within PCB 416 and to the PCB 416 can be accomplished before the PCB is adhered to the substrate 406. Depending on the aerogel material specifics, processes for depositing metal directly on the aerogel (e.g., electron beam, sputtering, evaporation, and inkjet printing, etc.) may be difficult to apply, may not adhere as well as the pressure sensitive adhesive, and may not give consistent performance, particularly when subject to scale-up for mass production. Designs mounting the PCB 416 to aerogels by other means (e.g., direct bonding, fastening, etc.) might subject to heating and/or chemical processes that may cause degradation of aerogel properties such as structural integrity or flexibility.

Substrate 406 may be relatively thick (~2 mm) to increase benefits from low dielectric constant for efficient radiation. In one exemplary configuration, substrate 406 may be 2.5 mm in thickness. However, other thicknesses may be possible. For example, substrate 406's thickness may range from 0.1 mm to 4 mm. Element 414 in FIG. 4 represents an aperture coupled patch antenna, with similar coupling as 314, discussed above. Element 414 can transmit signals across substrate 406 via aperture feed layer 420a.

Similarly to PCB 316, PCB 416 connections may be fabricated via photolithography, soldering, and metallization, among other techniques. PCB 416 may include stacked layers of electronics, such as layers 420a-f. Layers 420a-f may include any of the features discussed above in connection with layers 320a-f. These features include, in no particular order: power supply/regulation electronics and connections, digital processing components and connections, layers devoted to splitting RF signals among different portions of the antenna 200 (e.g., portions of the antenna whose signals may require different or separate processing, segments that are physically separated because of the antenna 200 layout or because of a stacked array of similar antennae 200, etc.), and layers devoted to signal processing and transmission.

Between metal layers 420a-f are structural layers 425a-g, which serve a similar purpose as structural layers 325a-e discussed above. Structural layers 425a-g may be made from the same or similar materials as structural layers 325a-e. These include laminates, plastics, resins, epoxies, polymers (e.g., PTFE), weaves (e.g., woven glass fibers), ceramics, hydrocarbon/ceramic composites with fiber reinforcements, etc. Fiberglass content from 0 to 50% in structural layers 425a-g is possible.

The bottom of stack 402 may include a transmit/receive module layer 450, similar in function and construction to transmit/receive module 330 in FIG. 3A. The transmit/receive module layer 450 can be specialized for the UAV application. However, it may not be. Conventional radio frequency transmit/receive modules 450 may also be used. In particular, commercially available transmit/receive (TR) chip modules may provide electronic weighting of signals. Also, layer 450 may include separate transmit and receiver modules.

Figure 5A:
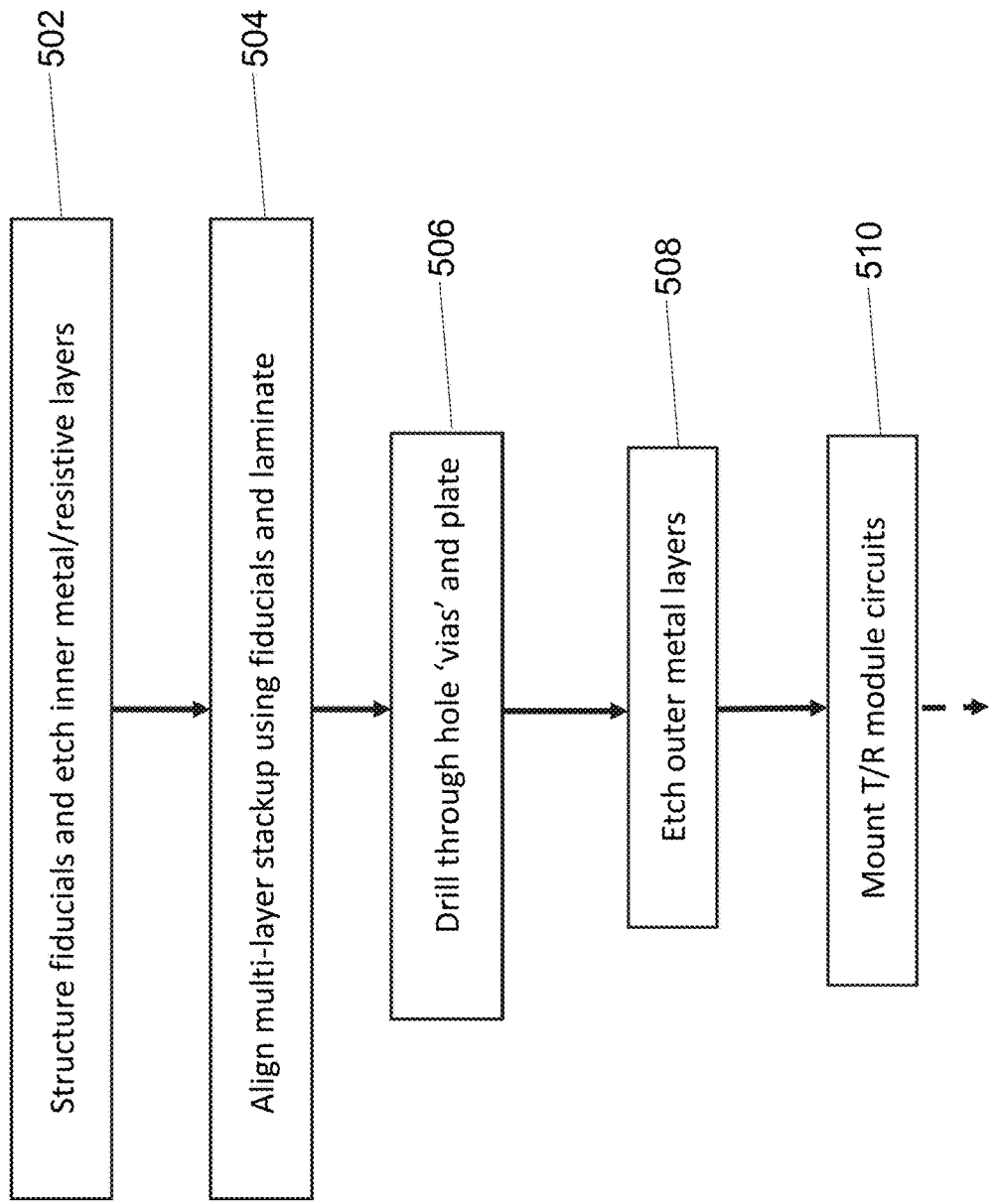
FIGS. 5A and 5B show a flow chart of an exemplary fabrication technique 500 for antenna 200.
Figure 5B:
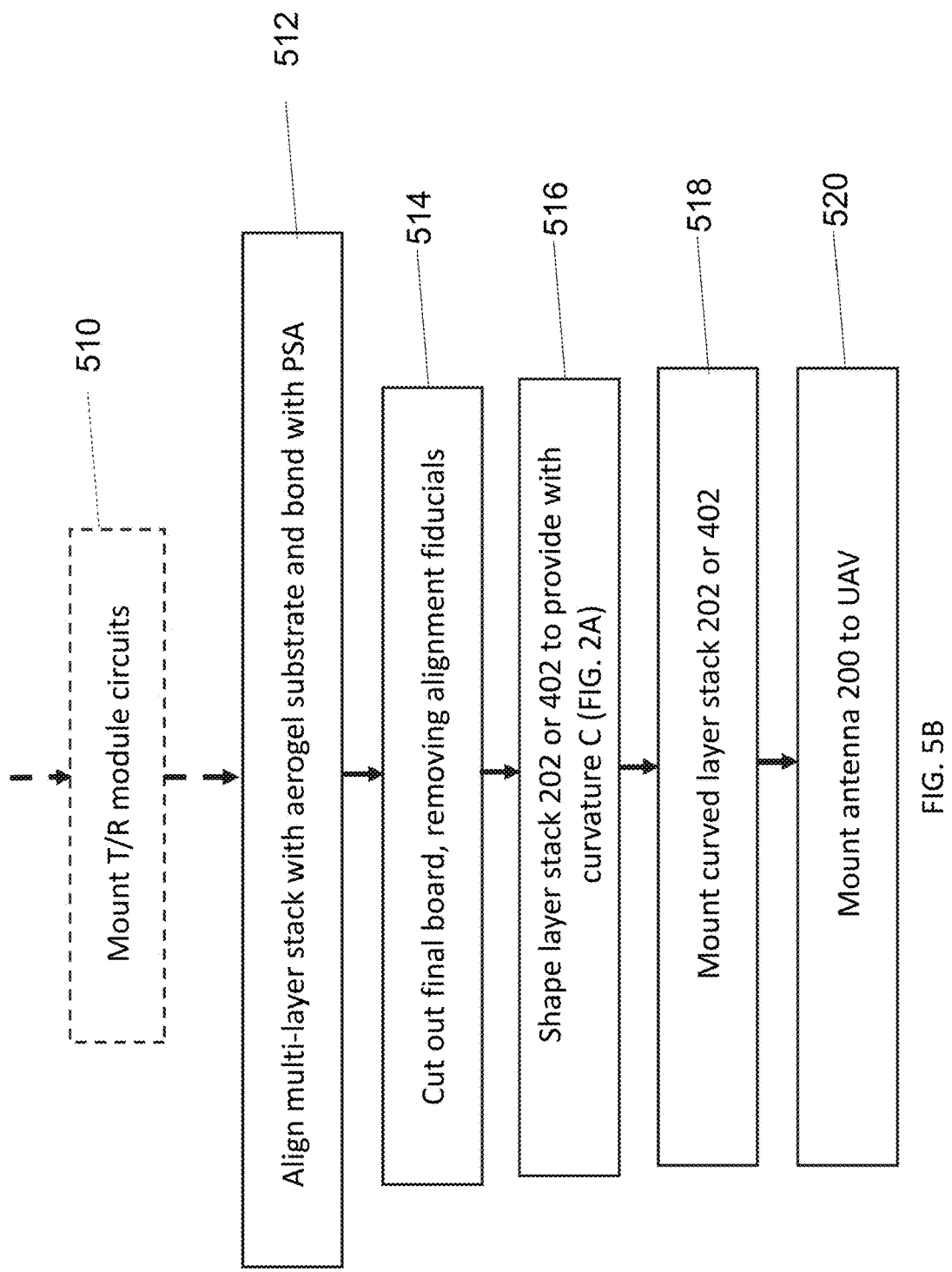

FIGS. 5A and 5B show a flow chart of an exemplary fabrication technique 500 for antenna 200. Technique 500 begins with the construction of PCB 316 or 416 and assumes the substrate (e.g. layers 306, 310, and 406, which may comprise aerogels and/or foams) has already been synthesized and prepared for mounting, e.g., according to U.S. Pat. Nos. 9,356,341; 10,428,181; and 10,446,920. However, it is to be understood that this sequence in not mandatory. For example, substrates 306, 310, and 406, or other components, may be fabricated after PCBs 316 and 416.

In step 502, fiducial markers are structured in PCB 316 or 416. The fiducial markers are used as a point of reference or measure for marking points on the PCB. Fiducial markers may be provided to all layers in the PCB (e.g., layers 320a-320f and 325a-325e in PCB 316 or layers 420a-420f and 425a-425g in PCB 416). In addition, in step 502, metal/resistive layers may be etched. The metal/resistive layers may include etching aspects of PCB layers 320a-320f in PCB 316 or layers 420a-420f in PCB 416). The etched structures may include, resistors, connections between resistors and other components, connections between layers in PCB 316 or 416, etc.

In step 504, the fiducials structured in step 502 may be used to line up the various layers (e.g., layers 320a-320f and 325a-325e in PCB 316 or layers 420a-420f and 425a-425g in PCB 416). Subsequently to lining up the layers, the layers of PCB 316 or 416 may then be laminated together. Any suitable lamination technique known in the art will suffice. For example, multilayer board lamination may be accomplished via heated hydraulic press. If through holes are already present, through hole "via" plating may be accomplished in step 504 via galvanic plating and/or conductive epoxy.

In step 506, holes may be drilled through layers, as necessary. The holes may establish through-holes, feedthroughs, wires, and vias for electrical connections. They may also accommodate structural components and/or fasteners, and/or mechanical aspects of a positioning system for antenna 200. Step 506 may also include metal plating of the through-holes or vias.

In step 508, outer metal layers of PCBs 316 and 416 can be etched. The etching can remove excess metals or other materials. Any suitable etchant may be used, including but not limited to, ferric chloride, ammonium persulfate, and sodium persulfate, or cupric chloride.

In step 510, transmit/receive module circuits (e.g., T/R modules 330 or 450) may be added. These module circuits may include circuits relating to any of the electronics disclosed in FIG. 2B in conjunction with layers 320a-f. Soldering and bonding of these components may best take place at this stage, prior to aerogel/foam substrate bonding. Hot-air surface mount soldering may also be used.

Continuing from FIG. 5A to FIG. 5B, in step 512, the PCBs 316 and 416 are aligned with their respective substrates and stacked patch elements and bonded with pressure sensitive adhesive (PSA). This step is shown in FIG. 3B for stacked element 314 and PCB 316. As discussed above, the alignment can be accomplished with alignment posts (e.g., posts 350) that fit into alignment holes (e.g., holes 360). It can further be accomplished using fiducial markings, for example.

In step 514, excess is cut from the final stacks 202 or 402. This cutting may, for example, remove alignment fiducials. Excess can be cut via any number of techniques, including mechanical (sawing, cutting, etc.). Additional techniques that can be used include metal etching through laser ablation, and milling. In this step, the alignment posts 350 and excess material accommodating the alignment holes 360 can also be removed.

Figure 6A:
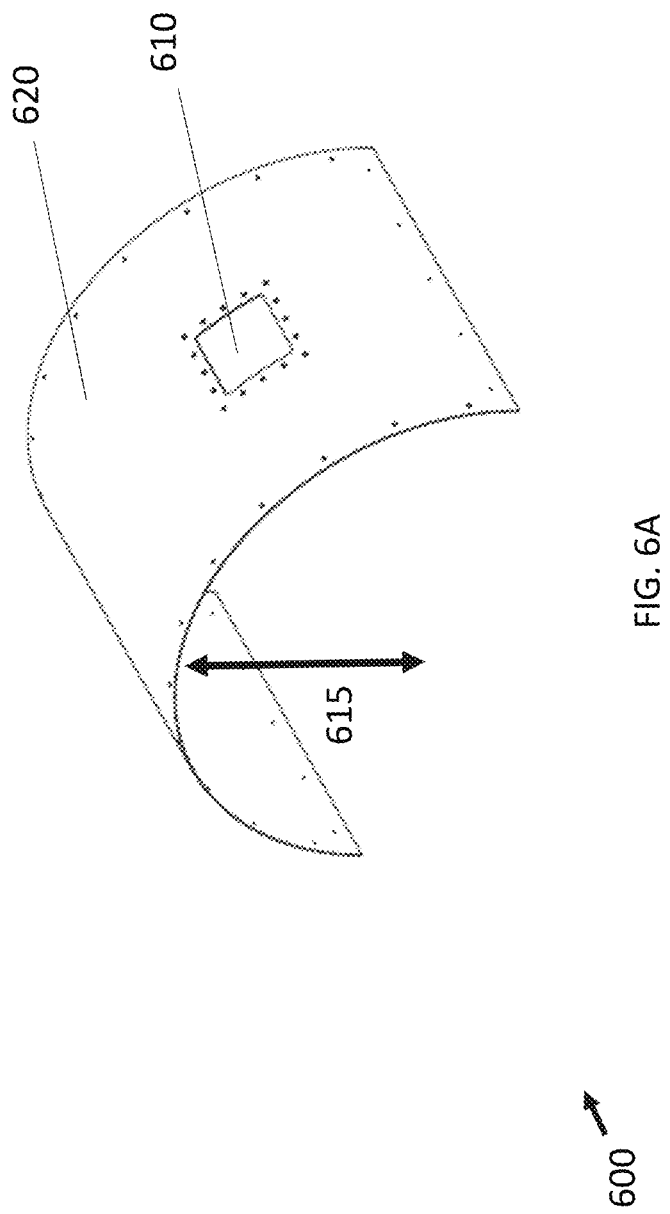
FIG. 6A shows a mounted phased array 610.

In step 516, the stack 202 or 402 may be subjected to shaping. Shaping can be performed by bending the stack 202 or 402 around a mandrel or other shaping component. The bending around a mandrel may produce the shape for layer stacks 202 or 402 to integrate on a UAV, with a portion shown for example in half cylinder structure 600 shown in FIG. 6A. FIG. 6A further shows layer 620 that may include carbon fiber and/or other structural material. Exemplary layer 620 is a UAV fuselage mock-up. In addition, as shown in FIG. 6A, the structure 600 includes conformal array 610, which comprises elements 302a/302b from FIG. 3A or elements 403 from FIG. 4. As shown in FIG. 6A, fuselage structure 600 has a radius 615 that may vary. In exemplary embodiments, radius 615 of approximately 16 inches may suffice. However, radius may vary from a few inches to 100 inches or more. Note that the shape of structure 600 in FIG. 6A is merely exemplary. Structure 600 may also be formed by a more complex shaped surface (e.g., oblate cylinder or airfoil).

Figure 6B:
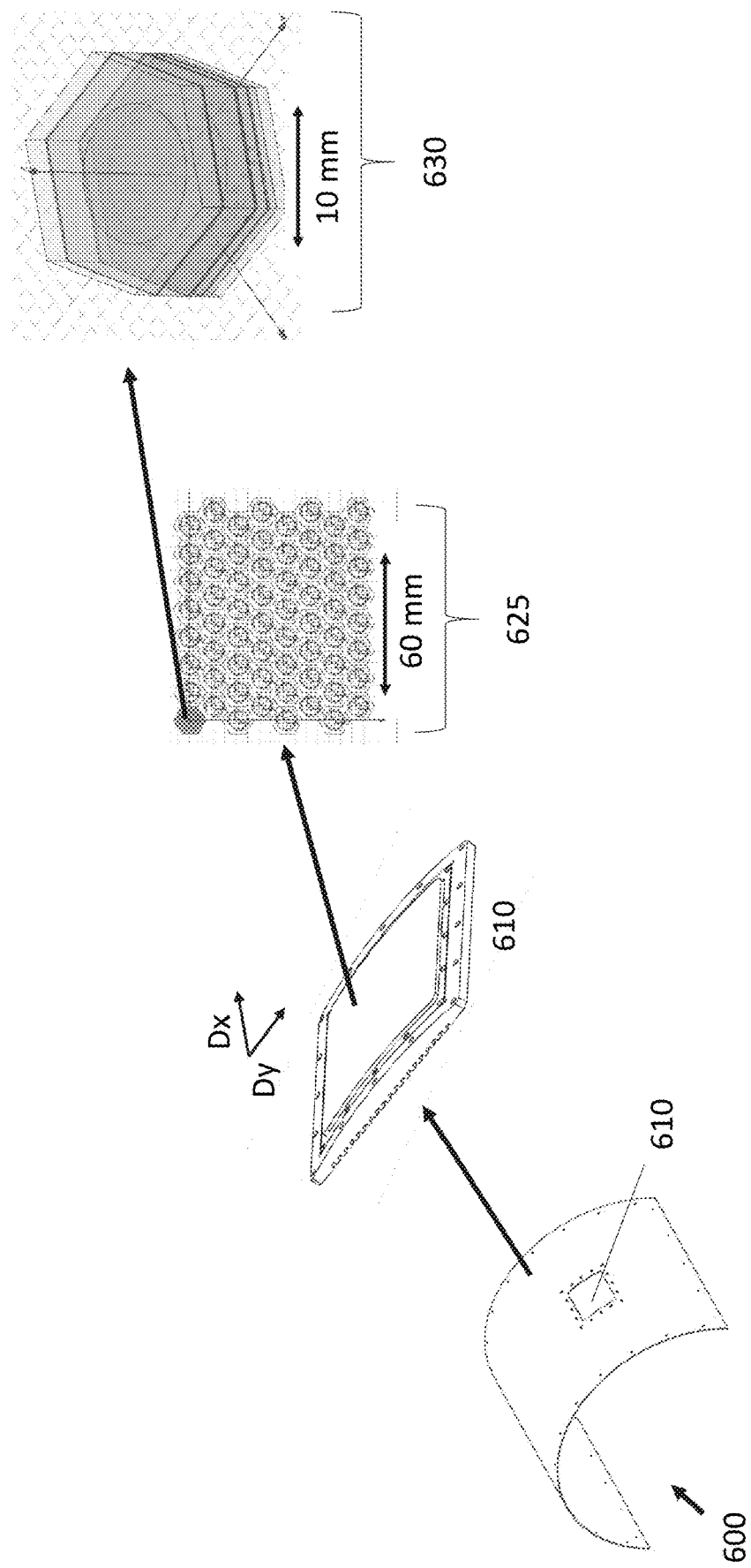
FIG. 6B shows the structure of the phased array 610 in detail.

FIG. 6B shows the structure of the phased array 610 in some detail. In particular, phased array 610 may be conformal to the rest of structure 600, as shown in FIG. 6B. Note that the patch array 610 represents a truncated, prototype phased array with 64 elements 630. It is to be understood that the phased array 610 may cover larger portions of structure 600 and may include any suitable number of elements 630. For example, phased array 610 may include more than 1024 elements 630, or even more than 2048 elements 630. The example phased array 610 including 64 elements shown in FIG. 6B was a prototype whose purpose was, among other things, to prove the concept of using a phased array with an aerogel substrate. Typical phased arrays 610 used in UAVs will have many more elements. Certain applications, including satellite applications such as those described in FIG. 1, may employ thousands of elements. It is to be understood that phased arrays 610 with thousands of elements are within the scope of the present disclosure.

In some variations, phased array 610 may cover the entire structure 600 for maximal power and angular coverage. As shown in FIG. 6B, the elements of phased array 610 may comprise an exemplary triangular lattice sub array 625 of circular patch elements 630. FIG. 6B shows a typical scale of 60 mm for the exemplary triangular lattice sub array 625. The scale is meant to be exemplary and will generally vary with the operating frequency range of the antenna. FIG. 6B shows detail of circular patch element 630 and, again, gives an exemplary size scale of 10 mm. It is to be understood that circular patch elements in accordance with the present disclosure can range in size scale from at least 1 mm to tens of mm. The element 630 may be a stacked circular patch antenna with a dual polarized aperture feed to maximize bandwidth. The apertures may be fed by offset stripline to increase coupling from the transmission line to the patch antennas. Dual linear polarization may allow for different polarized waves depending the beamforming electronics (linear, slant linear, circular and elliptical).

In the example shown in FIG. 6B, elements 630 are linearly polarized, aperture fed Ku-band elements for satellite communications. Elements 630 are represented in FIG. 3A as stacked element 302a/302b and in FIG. 4 as element 403. Circular polarization of elements 630 may mitigate axial misalignment of the antenna 200 and/or polarization of the phased array 610. Including aperture fed elements 630 can facilitate the use of aerogel substrates and avoidance of metal structures (e.g., feed throughs or through holes).

FIG. 6B shows phased array 610 as an exemplary array of elements 630. Although phased array 610 is composed of a triangular lattice of singular elements 630, it is to be understood that this configuration is merely exemplary. Other configurations (e.g., square, rectangular, etc.) may be used. Elements 630 are arranged in a matrix that allows shifting of the beam (i.e., anywhere in the plane defined by Dx and Dy shown in FIG. 6B).

Any suitable techniques known in the art for beamforming using phased arrays 610 may be employed. Other techniques are also possible. For example, phased array 610 may include a frequency scanning array in which the beam steering is controlled by the transmitters without the use of a phase shifter.

Figure 7:
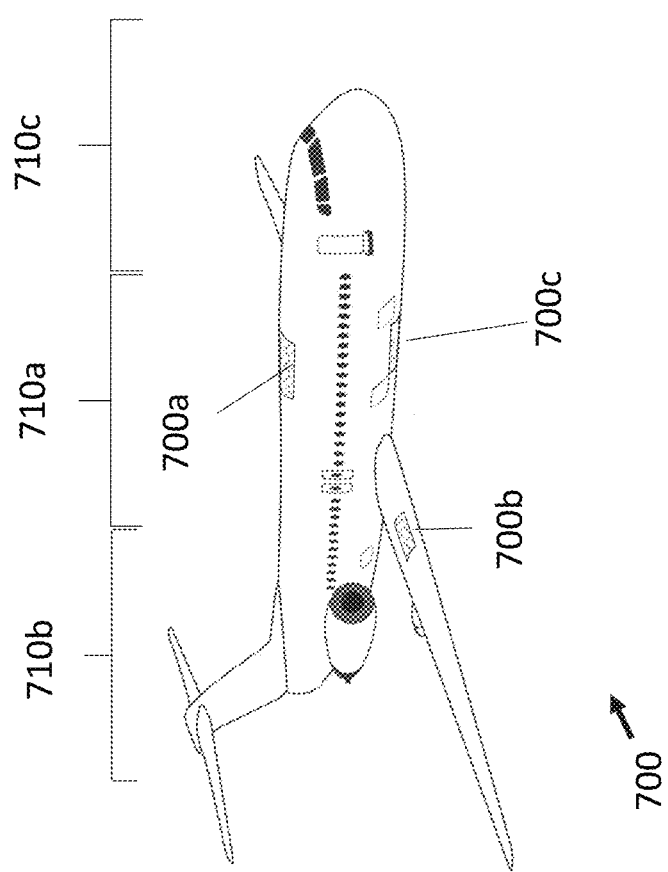
FIG. 7 shows antenna 200 mounted on a UAV 700.

Turning back again to FIG. 5B, in step 518 of exemplary fabrication technique 500, the curved layer structure 202 or 402, shaped as shown in FIG. 6A, is then mounted (as shown in FIG. 2A). The entire antenna 200 can be mounted on a UAV 700 in step 520, as shown in FIG. 7. As shown in FIG. 7, various exemplary antenna mountings (e.g., 700a, 700b, and 700c) may be flush with an exterior surface of the UAV 700. One of the advantages of the conformal antennas disclosed herein is that they can readily become a part of the exterior surface of the UAV 700, as shown.

As also shown in FIG. 7, the antenna 200 may be mounted on a spot 700a on the fuselage of the UAV 700 such that it faces upwards (e.g., towards satellites). Alterative mounting 700b is positioned on the wing of the UAV 700, also in an upward facing configuration. However, it is also understood that the antenna 200 may be mounted in other portions of the UAV 700. For example, antenna 200 may be mounted in position 700c such that it is ground facing. Similarly, antenna may be mounted in other ground-facing positions (not shown), e.g., on the underside of UAV 700's wings. Although exemplary mounting positions 700a, 700b, and 700c in FIG. 7 show the antenna 200 mounted in the central portion 710a of UAV 700, it is to be understood that other configurations are possible. For example, in some configurations, the antenna 200 may be mounted near the back 710b or front 710c of UAV 700.

In any of these configurations, the antenna 200 may be mounted in the UAV 700 such that the antenna's exterior (e.g., outer layer 202a in stacks 202 or 402) is exposed to the elements. Alternatively, antenna 200 may be mounted in an interior portion of UAV 700 such that antenna 200 is exposed by opening a door or portion of the exterior of UAV 700. In still other configurations, antenna 200 may be internally mounted in UAV 700 such that it is proximate to a window or radome (not shown) transparent to radio frequency radiation, such as to allow satellite communications. It is to be understood that still other mounting configurations are completed within the context of the present disclosure.

Figure 8:
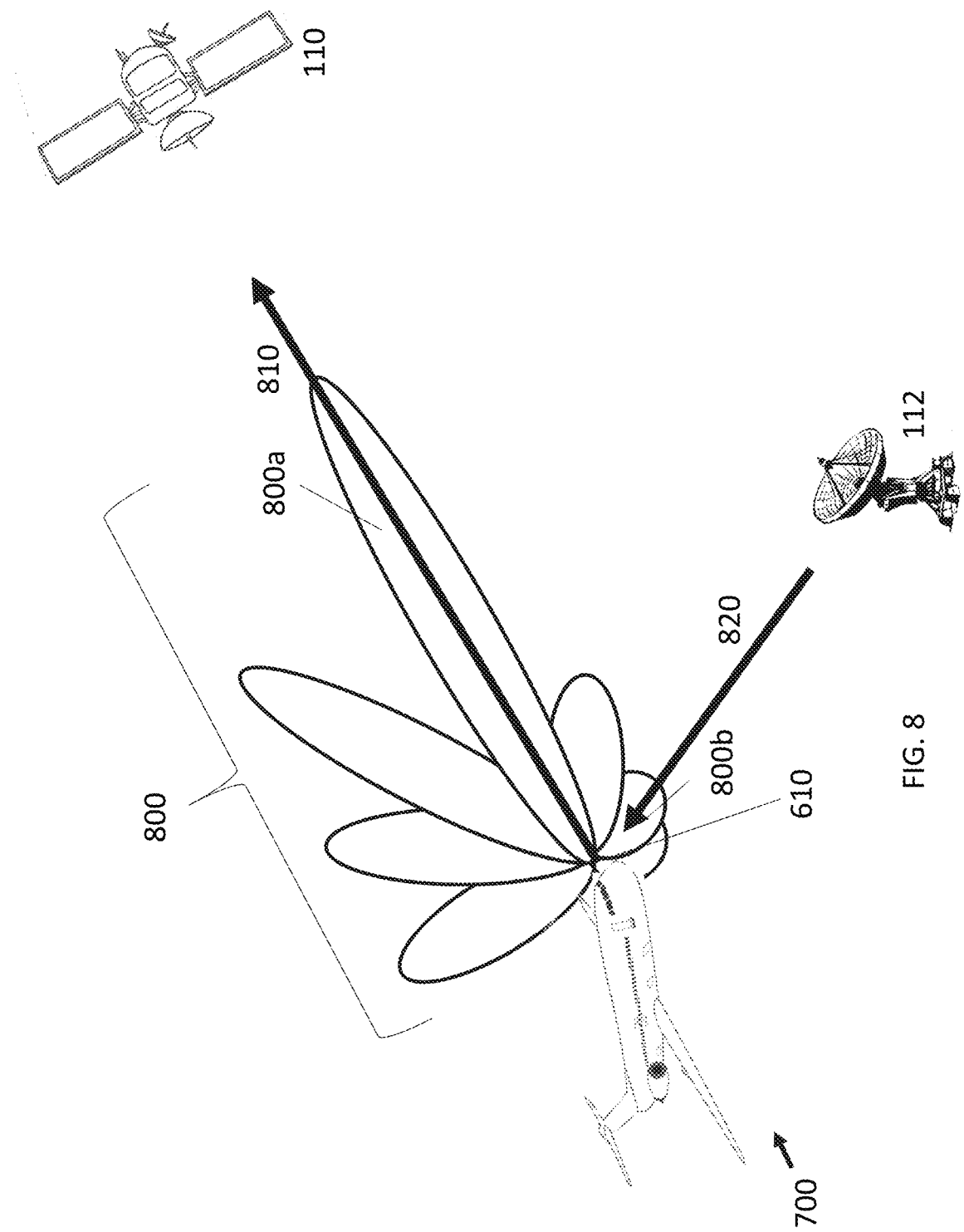
FIG. 8 shows a schematic of phased array 610 on UAV 700 in operation.

FIG. 8 shows a phased array 610 on UAV 700 in operation. As shown in FIG. 8, phased array 610 is being used to communicate with satellite 110. Phased array 610 uses electronic beamforming to direct radiation pattern 800 and create a main lobe amplitude 800a in the direction of satellite 110 for robust communications 810 (e.g., high signal power and gain) over the longer distances from the UAV 700 to the upper atmosphere. In addition, phased array 610 reduces amplitude of side lobes (e.g., side lobe 800*b*) to mitigate interreference 820 from ground station 112. In addition to the above, phased array 610 may beamform signal 800 for other purposes (e.g., to improve communications with ground station 112 when such communications are desired).

FIG. 8 shows a phased array produced gain distribution 800 that is asymmetrical about phased array 610. As explained above, such an asymmetrical gain distribution 800 may be useful in minimizing interference from a certain direction. In certain examples, the decreased direction (e.g., corresponding to lobe 800*b*) may be in the direction of interference. Other reasons for creating an asymmetric gain distribution 800 may be to avoid inadvertently sending sensitive signals or information to inappropriate or hostile entities. Such reasons further include minimizing or decreasing gain in certain directions to avoid saturating detectors either on UAV 700 itself, or on the devices receiving signals from the UAV 700 (e.g., ground station 112 or satellite 110). Although gain distribution 800 is one example of an asymmetrical gain distribution, it is possible to use phased array 610 to produce other distribution (e.g., other asymmetrical distributions and/or symmetrical distributions).

Figure 9:
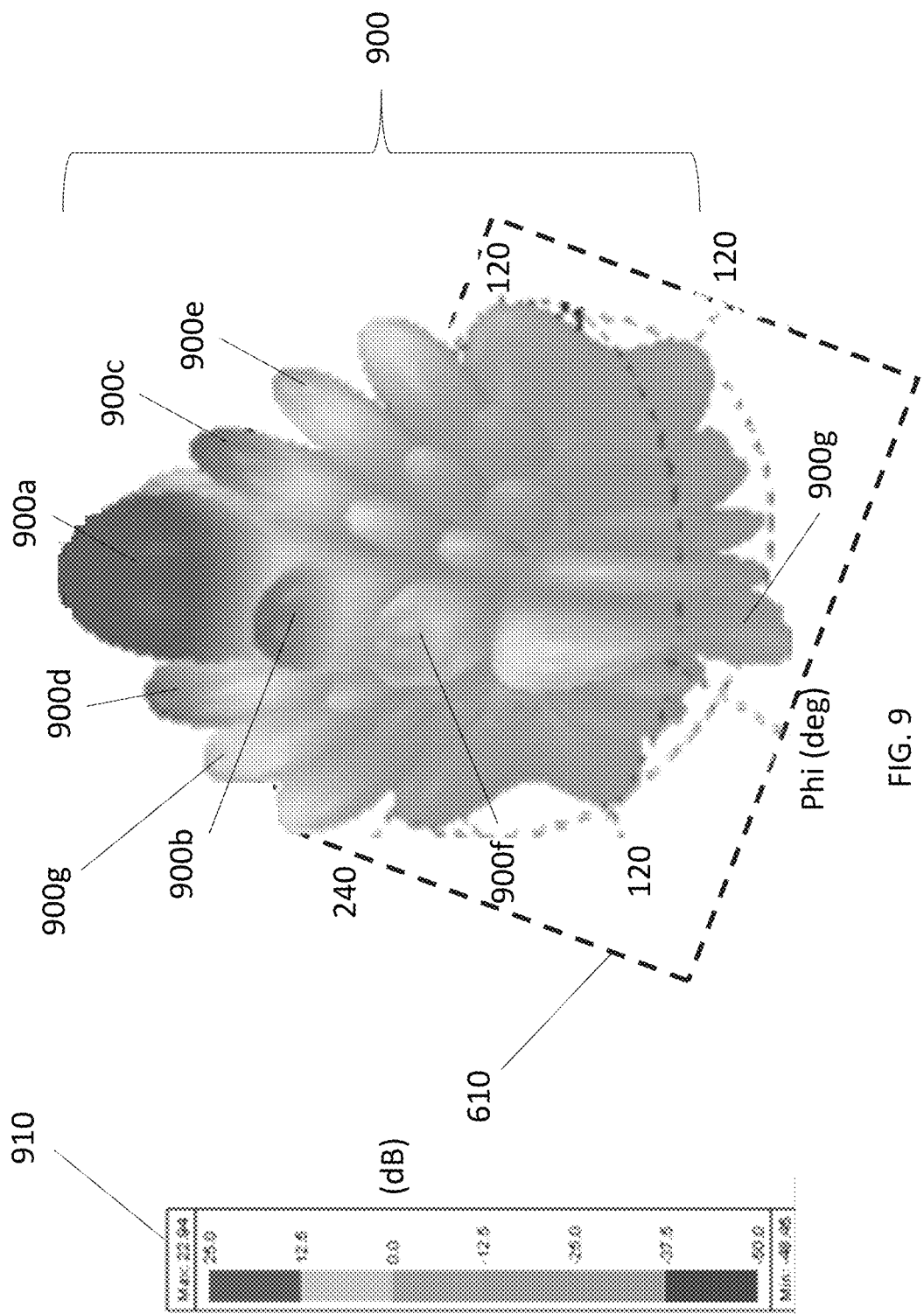
FIG. 9 shows detail of a simulated gain 900 for a 64 element phased array 610.

FIG. 9 shows detail of a simulated gain 900 for a 64 element phased array 610. Axis 910 provides gain in relative units as a ratio of radiation intensity in a direction to the average. As shown in FIG. 9, there is a main series of lobes 900*a-d*, which may be pointed toward a signal receiver (e.g., satellite 110 in FIG. 8). These lobes 900*a-d* are created by constructive interference from elements 630 in phased array 610. Lesser lobes (e.g., 900*e-g*) may be directed toward the same signal receiver. FIG. 9 also shows side lobes (e.g., 900*g*) of substantially diminished intensity.

FIG. 9 shows a symmetrical gain distribution 900. Such a distribution may be useful in the case in which there is relatively little interference from off-axis directions (i.e., directions away from the principal communication axis along lobe 900*a*). Symmetrical gain distributions are also useful for maximizing power in a certain direction (e.g., the direction of primary communication) when power/gain is at a premium. Since symmetrical gain distributions 900 provide maximal focus and directionality, they are also useful in cases when it is desired to minimize the possibility of signals sent or received from undesired sources off of the main axis. For example, symmetrical distributions 900 may decrease the possibility by signal interception from receiving devices not substantially aligned with the main lobe 900*a*.

While various inventive aspects, concepts and features of the inventions may be described and illustrated herein as embodied in combination in the exemplary embodiments, these various aspects, concepts and features may be used in many alternative embodiments, either individually or in various combinations and sub-combinations thereof. Unless expressly excluded herein all such combinations and sub-combinations are intended to be within the scope of the present inventions. Still further, while various alternative embodiments as to the various aspects, concepts and features of the inventions—such as alternative materials, structures, configurations, methods, circuits, devices and components, software, hardware, control logic, alternatives as to form, fit and function, and so on—may be described herein, such descriptions are not intended to be a complete or exhaustive list of available alternative embodiments, whether presently known or later developed. Those skilled in the art may readily adopt one or more of the inventive aspects, concepts or features into additional embodiments and uses within the scope of the present inventions even if such embodiments are not expressly disclosed herein. Additionally, even though some features, concepts or aspects of the inventions may be described herein as being a preferred arrangement or method, such description is not intended to suggest that such feature is required or necessary unless expressly so stated. Still further, exemplary or representative values and ranges may be included to assist in understanding the present disclosure, however, such values and ranges are not to be construed in a limiting sense and are intended to be critical values or ranges only if so expressly stated. Still further, exemplary or representative values and ranges may be included to assist in understanding the present disclosure, however, such values and ranges are not to be construed in a limiting sense and are intended to be critical values or ranges only if so expressly stated. Parameters identified as "approximate" or "about" a specified value are intended to include both the specified value and values within 10% of the specified value, unless expressly stated otherwise. Further, it is to be understood that the drawings accompanying the present application may, but need not, be to scale, and therefore may be understood as teaching various ratios and proportions evident in the drawings. Moreover, while various aspects, features and concepts may be expressly identified herein as being inventive or forming part of an invention, such identification is not intended to be exclusive, but rather there may be inventive aspects, concepts and features that are fully described herein without being expressly identified as such or as part of a specific invention, the inventions instead being set forth in the appended claims. Descriptions of exemplary methods or processes are not limited to inclusion of all steps as being required in all cases, nor is the order that the steps are presented to be construed as required or necessary unless expressly so stated.

We claim:

1. A method for manufacturing a phased-array, conformal antenna comprising:
    forming a substantially planar layered antenna structure by:
        fabricating a printed circuit board (PCB) on a substantially planar first substrate;
        adhering the PCB to a second substantially planar substrate, the second substantially planar substrate comprising an aerogel;
        adhering a plurality of antenna elements to the substantially planar second substrate to form the phased-array;
        adhering a protective layer to the one or more antenna elements; and
    shaping the substantially planar layered antenna structure to form a substantially curved layered antenna structure.

2. The method of claim 1, further comprising mounting comprises mounting the substantially curved layered antenna structure on an unmanned aerial vehicle (UAV).

3. The method of claim 1, wherein the phased-array comprises stacked patch elements and the adhering a plurality of antenna elements to the substantially planar second substrate forms the stacked patch elements.

4. The method of claim 1, further comprising forming an aperture feed layer that provides aperture coupling through a portion of the aerogel.

5. The method of claim 1, wherein the aerogel has a dielectric constant between 1.4 Dk and 1 Dk.

6. The method of claim 1, wherein the aerogel has a loss tangent of between 0.0001 and 0.005.

7. The method of claim 1, wherein a thickness of the aerogel is 0.8 mm or greater.

8. The method of claim 1, wherein an average pore size of the aerogel is 1-10 nm.

9. The method of claim 1, wherein the aerogel has a polyimide structure.

10. The method of claim 1, wherein the aerogel comprises at least one of 4,4'-oxydianiline (ODA), 2,2'-Dimethylbenzidine (DMBZ), 1,3-Bis(4-aminophenoxy)neopentane (BAPN), 1,5-diamino-2methylpentante (DAMP), and 1,12-diaminodocange (DADD).

11. The method of claim 1, wherein:
the phased-array, conformal antenna is designed to transmit and receive radiation in a wavelength range; and
an average pore size of the aerogel is smaller than the wavelength range.

12. The method of claim 1, wherein the adhering the PCB, the adhering the one or more antenna elements, and the adhering a protective layer comprises adhering via pressure sensitive adhesive.

13. The method of claim 1, wherein the substantially curved layered antenna structure has a radius of curvature of 32 inches or fewer.

14. The method of claim 1, wherein a density of the aerogel is less than 0.3 g/cm$^3$.

15. A phased-array, conformal antenna comprising:
a substantially curved layered antenna structure comprising:
 a printed circuit board (PCB);
 an aerogel adhered to the PCB;
 a plurality of antenna elements forming the phased-array, the plurality of antenna elements adhered to the aerogel; and
 a protective layer adhered to the plurality of antenna elements.

16. The antenna of claim 15, wherein a thickness of the aerogel is 2 mm or greater.

17. The antenna of claim 15, wherein an average pore size in the aerogel is 1-10 nm.

18. The antenna of claim 15, wherein the aerogel has a polyimide structure.

19. The antenna of claim 15, wherein the aerogel comprises at least one of 4,4'-oxydianiline (ODA), 2,2'-Dimethylbenzidine (DMBZ), 1,3-Bis(4-aminophenoxy)neopentane (BAPN), 1,5-diamino-2methylpentante (DAMP), and 1,12-diaminodocange (DADD).

20. The antenna of claim 15, wherein:
the phased-array, conformal antenna is designed to transmit and receive radiation in a wavelength range; and
an average pore size of the aerogel is smaller than the wavelength range.

* * * * *